United States Patent
Jung et al.

(10) Patent No.: US 11,842,945 B2
(45) Date of Patent: Dec. 12, 2023

(54) CHIP ON FILM PACKAGE AND DISPLAY APPARATUS INCLUDING THE SAME

(71) Applicant: SAMSUNG ELECTRONICS CO., LTD., Suwon-si (KR)

(72) Inventors: Jaemin Jung, Seoul (KR); Sanguk Han, Asan-si (KR); Yoonha Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/508,483

(22) Filed: Oct. 22, 2021

(65) Prior Publication Data
US 2022/0139799 A1 May 5, 2022

(30) Foreign Application Priority Data
Oct. 30, 2020 (KR) .................. 10-2020-0143874

(51) Int. Cl.
| | | |
|---|---|---|
| *H01L 25/18* | (2023.01) | |
| *H01L 23/373* | (2006.01) | |
| *H01L 23/498* | (2006.01) | |
| *H05K 1/18* | (2006.01) | |
| *H05K 1/02* | (2006.01) | |
| *H01L 23/00* | (2006.01) | |
| *H05K 1/14* | (2006.01) | |

(52) U.S. Cl.
CPC ...... *H01L 23/3735* (2013.01); *H01L 23/3733* (2013.01); *H01L 23/3737* (2013.01); *H01L 23/4985* (2013.01); *H01L 25/18* (2013.01); *H05K 1/0204* (2013.01); *H05K 1/189* (2013.01); *H01L 24/16* (2013.01); *H01L 24/73* (2013.01); *H01L 2224/16227* (2013.01); *H01L 2224/73204* (2013.01); *H05K 1/147* (2013.01); *H05K 2201/10128* (2013.01)

(58) Field of Classification Search
CPC . H01L 25/18; H01L 23/4985; H01L 23/3737; H01L 23/3733; H01L 23/3735
USPC .......................................................... 361/749
See application file for complete search history.

(56) References Cited

U.S. PATENT DOCUMENTS

| | | |
|---|---|---|
| 5,581,443 A | 12/1996 | Nakamura et al. |
| 10,585,310 B2 | 3/2020 | Ryu et al. |
| 2016/0027718 A1 | 1/2016 | Park et al. |

(Continued)

FOREIGN PATENT DOCUMENTS

| | | |
|---|---|---|
| CN | 205071567 | 3/2016 |
| CN | 105304593 | 3/2018 |
| CN | 110198624 | 9/2019 |

(Continued)

*Primary Examiner* — Tremesha S Willis
(74) *Attorney, Agent, or Firm* — F. CHAU & ASSOCIATES, LLC

(57) ABSTRACT

A chip-on-film package includes a base film including an upper surface and a lower surface that opposite from each other, a semiconductor chip mounted on the upper surface of the base film, a heat emission layer disposed on the lower surface of the base film to at least partially overlap the semiconductor chip in a thickness direction, an insulating layer disposed on a lower surface of the heat emission layer, and a protective layer surrounding side and lower surfaces of the insulating layer. Accordingly, thermal fatigue of the chip-on-film package may be reduced, and reliability may be increased.

15 Claims, 12 Drawing Sheets

(56) References Cited

U.S. PATENT DOCUMENTS

2018/0197831 A1* 7/2018 Kim .................... H01L 24/97
2020/0192433 A1   6/2020 Shin et al.

FOREIGN PATENT DOCUMENTS

| JP | 2017-036745 | 2/2017 |
| KR | 10-2001-0078953 | 8/2001 |
| KR | 10-2015-0141402 | 12/2015 |
| KR | 10-2016-0009496 | 1/2016 |

* cited by examiner

CHIP ON FILM PACKAGE AND DISPLAY APPARATUS INCLUDING THE SAME

CROSS-REFERENCE TO RELATED APPLICATION

This application claims priority under 35 U.S.C. § 119 to Korean Patent Application No. 10-2020-0143874, filed on Oct. 30, 2020, in the Korean Intellectual Property Office, the disclosure of which is incorporated by reference herein in its entirety.

TECHNICAL FIELD

The present disclosure relates to a chip-on-film (COF) package and a display apparatus including the same. More particularly, the present disclosure relates to a COF package, on which a display driver integrated circuit (IC) is mounted, and a display apparatus including the COF package.

DISCUSSION OF THE RELATED ART

Semiconductor chips are applied in various electronic devices, such as display panels. The semiconductor chip may be implemented in a chip-on-film (COF) package. In the COF package, a semiconductor chip may be mounted on a base film, and may be electrically connected to external device(s) through conductive lines.

There has been increasing, demand for display panels having decreased bezel size and panel thickness. As bezel size and panel thicknesses decrease, it may be become difficult to efficiently remove heat from a display device. Accordingly, a technique for controlling a temperature of a semiconductor chip mounted on the COF package is increasingly required.

SUMMARY

An embodiment of the present inventive concepts includes a chip-on-film (COF) package having increased heat radiation resistance and insulation features.

An embodiment of the present inventive concept includes a display apparatus including a COF package having increased heat radiation resistance and insulation features.

Technical goals of the inventive concepts are not limited to the above, and other technical goals and features that are not stated herein may be clearly understood by one of ordinary skill in the art from the descriptions below.

According to an aspect of the inventive concept, a chip-on-film package may include a base film including an upper surface and a lower surface opposite from each other, a semiconductor chip mounted on the upper surface of the base film, a heat emission layer disposed on the lower surface of the base film to at least partially overlap the semiconductor chip in a thickness direction, an insulating layer disposed on a lower surface of the heat emission layer, and a protective layer surrounding side and lower surfaces of the insulating layer.

According to another aspect of the inventive concept, a chip-on-film package may include a base film including an upper surface and a lower surface opposite from each other, wherein a chip mount area is defined on the upper surface, a conductive line disposed on the upper surface of the base film and including a conductive pad on an end portion of the conductive line, a semiconductor chip mounted in the chip mount area and including a long side in a first direction and a short side in a second direction perpendicular to the first direction, a protection layer on the conductive line and the upper surface of the base film to expose the conductive pad, a bump structure arranged between the conductive pad and a bump pad of the semiconductor chip, an underfill filled between the semiconductor chip and the base film and surrounding the bump structure, a heat emission layer disposed on the lower surface of the base film to at least partially overlap the chip mount area in a thickness direction, an insulating layer disposed on a lower surface of the heat emission layer, a first adhesive layer arranged between the base film and the heat emission layer, a second adhesive layer arranged between the heat emission layer and the insulating layer, and a protective layer surrounding side and lower surfaces of the insulating layer.

According to another aspect of the inventive concept, a display apparatus may include a chip-on-film package including a base film that includes an upper surface and a lower surface opposite from each other, a display panel contacting a portion of the upper surface of the base film, and a driving printed circuit board contacting another portion of the upper surface of the base film, wherein the chip-on-film package includes a base film including the upper surface and the lower surface opposite from each other, a display driver IC mounted on the upper surface of the base film, a heat emission layer disposed on the lower surface of the base film to at least partially overlap the display driver IC in a thickness direction, an insulating layer disposed on a lower surface of the heat emission layer, and a protective layer surrounding side and lower surfaces of the insulating layer.

BRIEF DESCRIPTION OF THE DRAWINGS

The above and other aspects and features of the present disclosure will become more apparent by describing in detail exemplary embodiments thereto with reference to the attached drawings, in which.

DETAILED DESCRIPTION OF THE EMBODIMENTS

Figure 1:
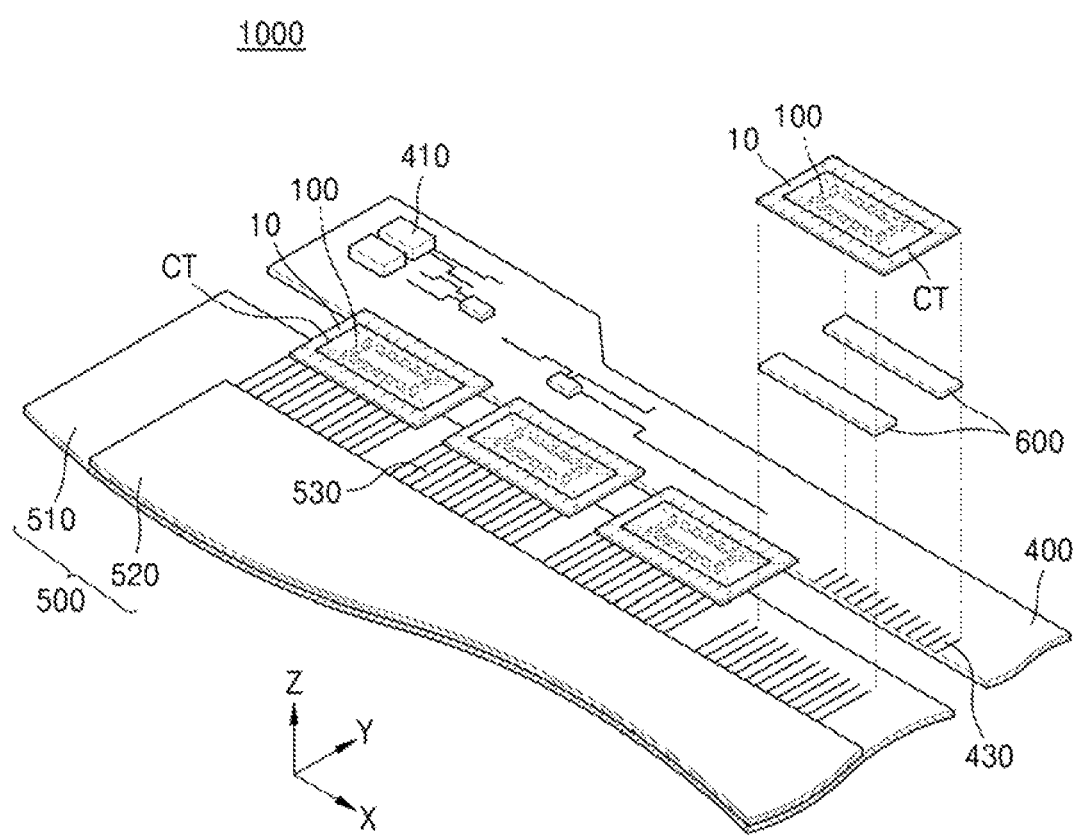
FIG. 1 is a perspective view of a display apparatus according to an embodiment.

Hereinafter, various example embodiments will be described in detail with reference to the accompanying drawings. Like reference symbols in the drawings may denote like elements, and to the extent that a description of an element has been omitted, it may be understood that the element is at least similar to corresponding elements that are described elsewhere in the specification. Additionally, description of a singular element may apply to a plurality of the same elements, unless the context of the description or referenced drawings indicates otherwise.

Further, when an element is stated to be "on" or "disposed on" another element, the elements may be in direct contact with each other, or there may be interposing layers therebetween. Additionally, when an element is stated to "surround" another element or sides/portions of another element the surrounding element may surround all of or at least a portion of the surrounded element.

FIG. 1 is a perspective view of a display apparatus according to an embodiment.

Referring to FIG. 1, a display apparatus 1000 may include at least one chip-on-film (COF) package 10, a driving printed circuit board 400, and a display panel 500.

The COF package 10 may include a semiconductor chip 100 that is a display driver IC (DDI). In some embodiments, one semiconductor chip 100 may be arranged in one COF package 10. In other embodiments, different types of semiconductor chips 100 may be arranged in one COF package 10. For example, the semiconductor chip 100 may include a source driver chip and/or a gate driver chip. Also, the COF package 10 may include a composite material tape CT.

The COF package 10 may be disposed between and electrically connected to the driving printed circuit board 400 and the display panel 500. The COF package 10 may be configured to receive a signal output from the driving printed circuit board 400 and transmit the signal to the display panel 500.

One or more driving circuit chips 410 may be mourned on the driving printed circuit board 400. The one or more driving circuit chips 410 may simultaneously or sequentially apply power and signals to the COF package 10.

The display panel 500 may be, for example, a liquid crystal display (LCD) panel, a light emitting diode (LED) panel, an organic LED (OLED) panel, a plasma display panel (PDP), or the like.

The COF packages 10 may be electrically connected to driving connection lines 430 of the driving printed circuit board 400 and panel connection lines 530 of the display panel 500, respectively.

In some embodiments, one COF package 10 may be connected between the driving printed circuit board 400 and the display panel 500. For example, when the display panel 500 is designed to provide a relatively small screen, such as for a mobile phone or to support a relatively low resolution, the display apparatus 1000 may include one COF package 10.

In other embodiments, multiple COF packages 10 may be connected between the driving printed circuit board 400 and the display panel 500. For example, when the display panel 500 is designed to provide a relatively large screen, such as for a television or to support a relatively high resolution, the display apparatus 1000 may include COF packages 10.

The COF package 10 may be connected to only one side of the display panel 500. However, one or more embodiments are not necessarily limited thereto. One or more COF packages 10 may be respectively connected to two or more sides of the display panel 500.

The display panel 500 may include a transparent substrate 510, an image area 520 formed on the transparent substrate 510, and the panel connection lines 530. The transparent substrate 510 may be, for example, a glass substrate or a flexible substrate. Pixels arranged in the image area 520 may be connected to the corresponding panel connection lines 530 and may be driven according to signals provided by the semiconductor chip 100 mounted on the COF package 10.

An input pad may be formed on one edge of the COF package 10, and an output pad may be formed on the other edge of the COF package 10. The input pad and the output pad may be respectively connected to the driving connection lines 430 of the driving printed circuit board 400 and the panel connection lines 530 of the display panel 500 by an anisotropic conductive layer 600.

The anisotropic conductive layer 600 may include, for example, an anisotropic conductive film or an anisotropic conductive paste. The anisotropic conductive layer 600 may have a structure in which conductive particles are dispersed in an insulating adhesive layer. The anisotropic conductive layer 600 may have anisotropic electric features so that an electric current is allowed to flow only in an electrode direction (ex., a Z direction) and is insulated in another direction (ex., an X direction) between neighboring electrodes. When heat and pressure are applied to the anisotropic conductive layer 600 to melt an adhesive, the conductive particles may be arranged between opposing electrodes. For example, the conductive particles may be arranged between the input pad and the driving connection lines 430 and between the output pad and the panel connection lines 530, and thus, current may flow between opposing electrodes. On the contrary, an adhesive may fill a gap between neighboring electrodes, and thus, the neighboring, electrodes may be insulated from each other.

Hereinafter, the COF package 10 included in the display apparatus 1000 according to an embodiment will be described in detail.

Figure 2:
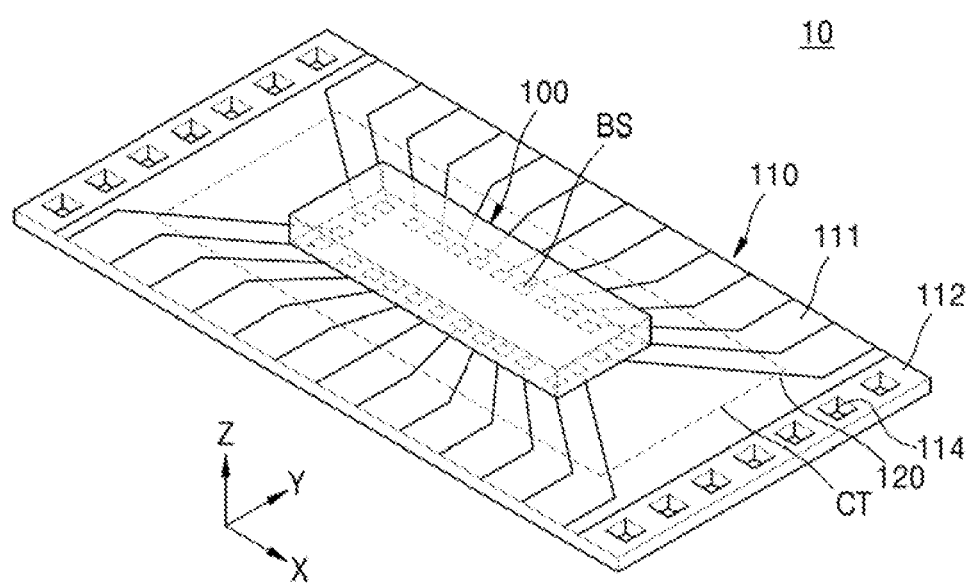
FIG. 2 is a perspective view of a chip-on-film (COF) package according to an embodiment.
Figure 3:
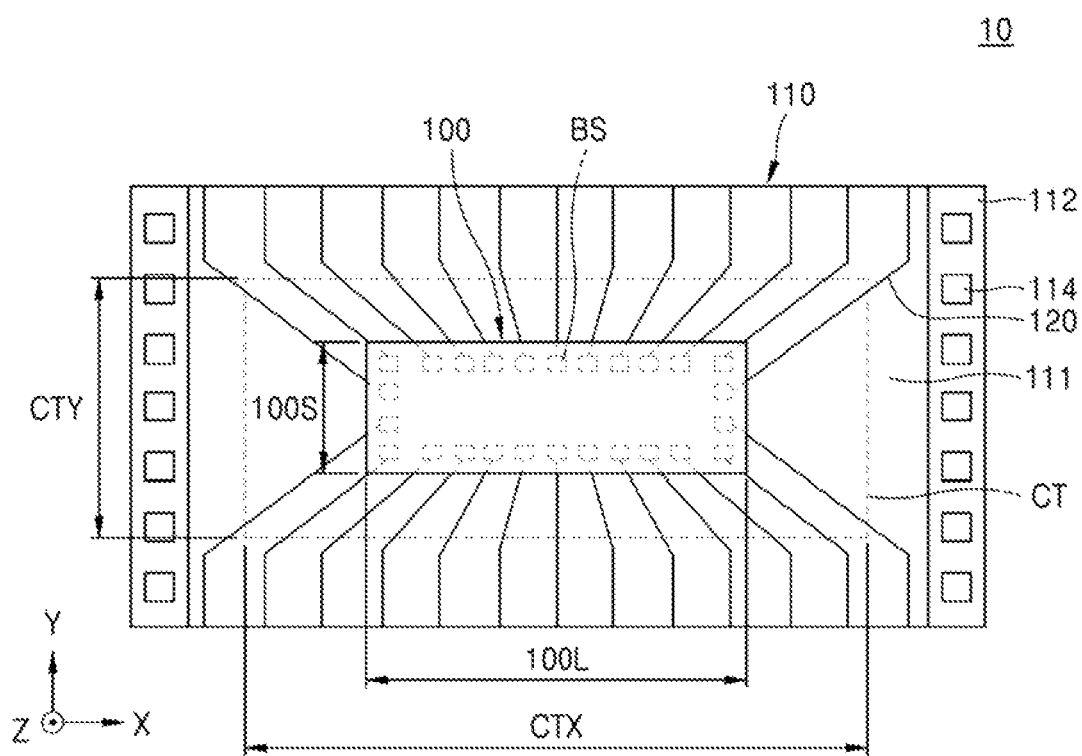
FIG. 3 is a plan view of the COF package of FIG. 2.
Figure 4:
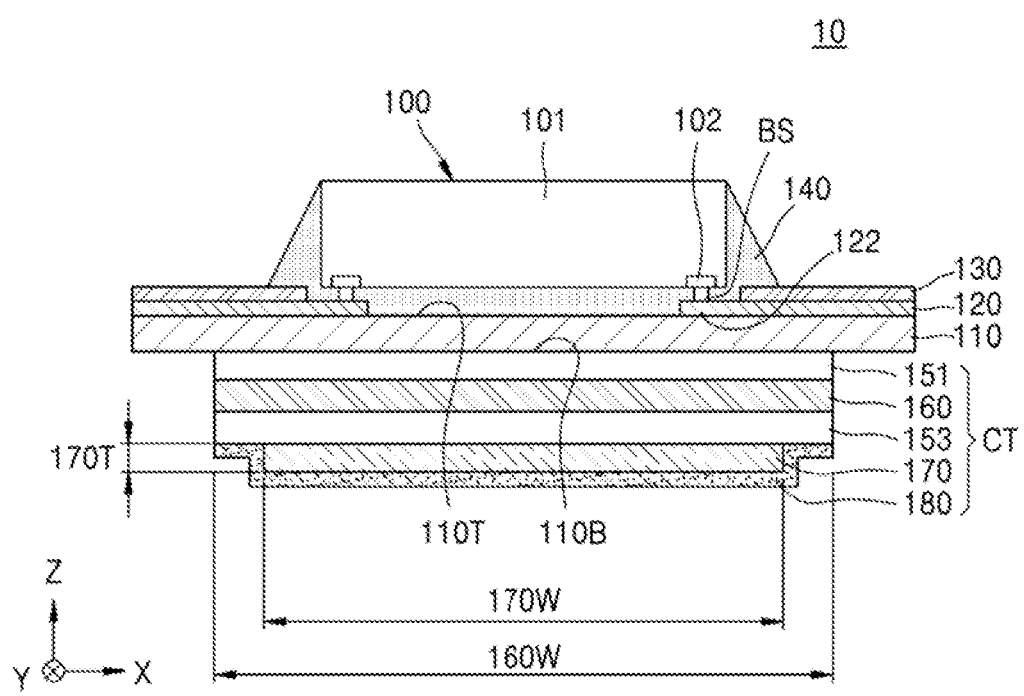
FIG. 4 is a side cross-sectional view of the COF package of FIG. 2 obtained by cutting a circuit area of the COF package.

FIGS. 2 to 4 are schematic diagrams of a COF package according to an embodiment. FIG. 2 is a perspective view of a COF package, FIG. 3 is a plan view of the COF package of FIG. 2, and FIG. 4 is a side cross-sectional view of the COF package of FIG. 2 by cutting a circuit area of the COF package.

Referring to FIGS. 2 to 4, the COF package 10 may include a semiconductor chip 100, a base film 110, and a composite material tape CT.

The semiconductor chip 100 may be a DDI used to drive the display apparatus 1000 (see FIG. 1). For example, the semiconductor chip 100 may be a source driver chip configured to generate an image signal by using a data signal transmitted from a timing controller and output the image signal to the display panel 500 (see FIG. 1). Alternatively, the semiconductor chip 100 may be a gate driver chip configured to output scan signals including on/off signals of a transistor to the display panel 500.

However, the type of the semiconductor chip 100 is not necessarily limited to the above-described examples. For example, when the COF package 10 is coupled to another electronic apparatus instead of the display apparatus 1000 (see FIG. 1), the semiconductor chip 400 may drive the electronic apparatus.

For convenience of explanation, one semiconductor chip 100 is illustrated in the drawings, but the number of semiconductor chips 10 is not necessarily limited thereto. In some embodiments, the number of source driver chips may be identical to or greater than the number of gate driver chips according to features of the display apparatus 1000 (see FIG. 1).

The semiconductor chip 100 may have a long side 100L in a first direction (ex., the X direction) and a short side 100S in a second direction (ex., a Y direction) perpendicular to the first direction (ex., the X direction). For example, the semiconductor chip 100 may have a rectangular shape. A length of the long side 100L may be 1.5 times a length of the short side 100S. The semiconductor chip 100 may be designed to have the aforementioned structure to increase the integration of an arrangement of conductive lines 120 described below as well as a degree of design freedom.

The semiconductor chip 100 may include a substrate 101 and a bump pad 102. The substrate 101 may be a semiconductor substrate and include an active surface and a non-active surface adjacent to each other. The substrate 101 may be a silicon (Si) wafer including crystalline silicon, polycrystalline silicon, or amorphous silicon. Alternatively, the substrate 101 may include a semiconductor atom such as germanium (Ge) or compound semiconductors such as silicon carbide (SiC), gallium arsenide (GaAs), indium arsenide (InAs), and indium phosphide (InP).

The substrate 101 may have a silicon on insulator (SOI) structure. In some embodiments, the substrate 101 may include a conductive area, for example, a well which is doped with impurities or a structure which is doped with impurities. Also, the substrate 101 may have a device isolation structure such as a shallow trench isolation (STI) structure.

The semiconductor chip 100 may be arranged in a circuit area 111 of the base film 110. Particularly, the semiconductor chip 100 may be arranged in a chip mount area, and may be mounted on the base film 110 through a flip-chip bonding process. For example, bump structures BS such as solder balls may be disposed on the bump pad 102 which is exposed on an active surface of the semiconductor chip 100, and the bump structure BS may be physically and electrically coupled to a conductive pad 122 of the base film 110. Thus, the semiconductor chip 100 may be mounted on the base film 110. Some of the bump pads 102 may function as input terminals, and the others of the bump pads 102 may function as output terminals.

The bump structures BS may respectively contact the bump pads 102 and the conductive pads 122 and may electrically connect the bump pads 102 and the conductive pads 122 to each other. By way of the bump structure BS, the semiconductor chip 100 may receive at least one of a control signal, a power signal, and a ground signal for driving the semiconductor chip 100. The semiconductor chip 100 may also receive a data signal to be stored in the semiconductor chip 100, or provide data stored in the semiconductor chip 100 to the outside. The bump structure BS may have a pillar structure, a ball structure, or a solder layer structure.

The base film 110 may include polyimide having a high coefficient of thermal expansion (CTE) and high durability. However, materials of the base film 110 are not necessarily limited thereto. The base film 110 may include, for example, epoxy-based resin, synthetic resin such as acrylic, polyether nitrile, polyether sulfone, polyethylene terephthalate, or polyethylene naphthalate, or the like.

The base film 110 may include the circuit area 111 at the center of the base film 110 and perforation (PF) areas 112 that are disposed on both side portions of the circuit area 111. For example, the PF areas 112 may be disposed on opposite side portions of the circuit area 111 along the first direction (ex., the X direction). The semiconductor chip 100 may be mounted within the circuit area 111.

The PF regions 112 may be disposed on both side portions of die base film 110 and may include PF holes 114. Reeling and winding of the base film 110 by a winding reel may be controlled through the PF holes 114.

Because pitches of the PF holes 114 are uniform, a length of the base film 110 may be determined according to the number of PF holes 114. A width and the length of the base film 110 may be determined, inter alia, according to the number and sizes of semiconductor chips 100 mounted on the base film 110 and arrangements of the conductive lines 120 formed on the base film 110.

The PF area 112 may be cut before the COF package 10 is arranged in the display apparatus 1000 (see FIG. 1). For example, in the COF package 10, only the circuit area 111 of the base film 110 may be arranged in the display apparatus 1000 (as illustrated in FIG. 1).

The conductive lines 120 may be disposed on an upper surface 110T of the base film 110. The conductive lines 120 may include the conductive pads 122 on end portions thereof. The conductive lines 120 may include, for example, aluminum foil or copper foil. In some embodiments, the conductive lines 120 may be formed by patterning a metal layer formed on the base film 110, through a process such as casting, laminating, or electro-plating.

The conductive pad 122 may be a portion of the conductive line 120 or a portion of the conductive line 120 further plated with tin (Sn), gold (Au), nickel (Ni), lead (Pb), or the like. In some embodiments, the conductive pad 122 may be electrically connected to the conductive line 120 and may include a conductive material that is separately formed. The conductive pad 122 may be disposed proximate to the bump pad 102 of the semiconductor chip 100 and may be electrically connected to the bump pad 102.

A protection layer 130 may be formed on the upper surface 110T of the base film 110 to protect the conductive lines 120 from external physical and/or chemical damage. The protection layer 130 may cover the conductive lines 120 and expose the conductive pad 122 of the conductive line 120 formed on the upper surface 110T of the base film 110. The protection layer 130 may be formed as, for example, solder resist or dry film resist. However, one or more embodiments are not necessarily limited thereto. The protection layer 130 may be formed as an insulating layer based on silicon oxide or silicon nitride.

An underfill 140 may be filled between the semiconductor chip 100 and the base film 110 to protect the bump structure BS and neighboring portions of the bump structure BS from external physical and/or chemical damage. In some embodiments, the underfill 140 may be formed through a capillary underfill process. The underfill 140 may include, for example, epoxy resin, but is not necessarily limited thereto.

The composite material tape CT may include a first adhesive layer 151, a heat emission layer 160, a second adhesive layer 153, an insulating layer 170, and a protective layer 180. The composite material tape CT may be arranged such that the first adhesive layer 151 is attached to a lower surface 110B of the base film 110. For effective heat radiation and insulation, a first width CTX of the composite material tape CT in the first direction (ex., the X direction) may be greater than the length of the long side 100L of the semiconductor chip 100, and a second width CTY of the composite material tape CT in the second direction (ex., the Y direction) may be greater than the length of the short side 100S of the semiconductor chip 100. In some embodiments, the composite material tape CT may be a flexible tape.

The first adhesive layer 151 may be disposed on the lower surface 110B of the base film 110. The first adhesive layer 151 may be classified as an inorganic adhesive or a polymer adhesive. Polymers may be roughly classified into thermosetting resin and thermoplastic resin. The thermosetting resin may have a three-dimensional (3D) cross-link structure after a monomer is heated and molded and may not be softened even when reheated. By contrast, the thermoplastic resin may have variable plasticity with applied heat and may have a linear polymer structure. In some embodiments, the first adhesive 151 may be a tape, but is not necessarily limited thereto.

The heat emission layer 160 may be disposed on a lower surface of the first adhesive layer 151. The heat emission layer 160 may be arranged beneath the lower surface 110B of the base film 110 to correspond to the semiconductor chip 100, and may radiate heat emitted from the semiconductor chip 100. For effective heat radiation, a width of the heat emission layer 160 in the first direction (ex., the X direction) may be greater than the length of the long side 100L of the semiconductor chip 100, and a width of the heat emission layer 160 in the second direction (ex., the Y direction) may be greater than the length of the short side 100S of the semiconductor chip 100.

In some embodiments, the heat emission layer 160 may be a tape including metal. The metal may include one or more of for example, aluminum (Al), copper (Cu), tungsten (W), or the like, but is not necessarily limited thereto. In other embodiments, the heat emission layer 160 may include epoxy, acrylic, silicon, or the like, and the resin may include a thermally conductive filler to increase heat radiation. The thermally conductive filler may include alumina ($Al_2O_3$), boron nitride (BN), aluminum nitride (AlN), or diamond. Also, the heat emission layer 160 may include a curable material. For example, the heat emission layer 160 may include resin allowing thermal curing, room-temperature curing, or UV curing.

The second adhesive layer 153 may be disposed on the lower surface of the beat emission layer 160. The second adhesive layer 153 may include substantially the same material as the first adhesive layer 151 in substantially the same form. The second adhesive layer 153 may be in the form of adhesive tape, but is not necessarily limited thereto.

The insulating layer 170 may be disposed on a lower surface of the second adhesive layer 153. The insulating layer 170 may be arranged beneath the lower surface 110B of the base film 110 to correspond to the semiconductor chip 100 and may block the heat emitted from the semiconductor chip 100. For effective insulation, a width of the insulating layer 170 in the first direction (ex., the X direction) may be greater than the length of the long side 100L of the semiconductor chip 100, and a width of the insulating layer 170 in the second direction (ex., the Y direction) may be greater than the length of the short side 100S of the semiconductor chip 100.

The width 170W of the insulating layer 170 may be less than a width 160W of the heat emission layer 160. For example, the width of the insulating layer 170 in the first direction (ex., the X direction) may be less than the width of the heat emission layer 160 in the first direction (ex., the X direction), and the width of the insulating layer 170 in the second direction (ex., the Y direction) may be less than the width of the heat emission layer 160 in the second direction (ex., the Y direction). Also, to prevent the insulation features of the insulating layer 170 from inhibiting heat transfer via the heat emission layer 160, a thickness 170T of the insulating layer 170 in a third direction (ex., the Z direction) may be between about 30 μm and about 100 μm.

The insulating layer 170 may be a tape including a heat-resistant material. The heat-resistant material may be, for example, heat resistant fiber, graphite, polyurethane, or the like, but is not necessarily limited thereto. The insulating layer 170 may include a material that is melted at a temperature exceeding about 150° C. and has thermal conductivity in a range from about 0.02 W/(m·K) to about 0.08 W/(m·K). However, the material of the insulating layer 170 is not necessarily limited thereto. Also, the insulating layer 170 may include a curable material. For example, the insulating layer 170 may include resin allowing thermal curing, room-temperature curing, or UV curing.

A protective layer 180 may protect the composite material tape CT from external physical and/or chemical damage. The protective layer 180 may also prevent possible contaminants from the insulating layer 170 from being discharged to the outside. To achieve these properties, the protective layer 180 may surround side and lower surfaces of the insulating layer 170. For example, the protective layer 180 may be conformally formed on the insulating layer 170 to prevent the insulating layer 170 from being exposed to the outside. The protective layer 180 may include, for example, a carbon-containing material. As described below, the protective layer 180 may be formed by using a spray coating method.

As demand for reduced bezel 700 (see FIG. 11) size and display panel 500 (see FIG. 11) thickness of the display apparatus 1100 (see FIG. 11) increases, the need for a technique for controlling a temperature of the semiconductor chip 100 mounted on the COF package 10 is also increases. To meet this need, a display device according to the present inventive concepts includes the heat emission layer 160 to guide an effective discharge of the heat emitted from the semiconductor chip 100 to the outside of the COF package 10. However, as the bezel 700 (see FIG. 11) decreases in size due to size constraints, temperatures greater than a certain temperature may be transmitted to the bezel 700. In such cases, the temperature of the display apparatus increases, and problems may occur in the display apparatus 1100 (see FIG. 11).

The COF package 10 may provide the necessary heat radiation and insulation features to address the issues discussed above by using the composite material tape CT including the heat emission layer 160 and the insulating layer 170.

The COF package 10 and the display apparatus 1100 (see FIG. 11) including the same may be configured to reduce thermal fatigue and increase thermal resistance, and thus, the reliability of a product may be increased.

Figure 5:
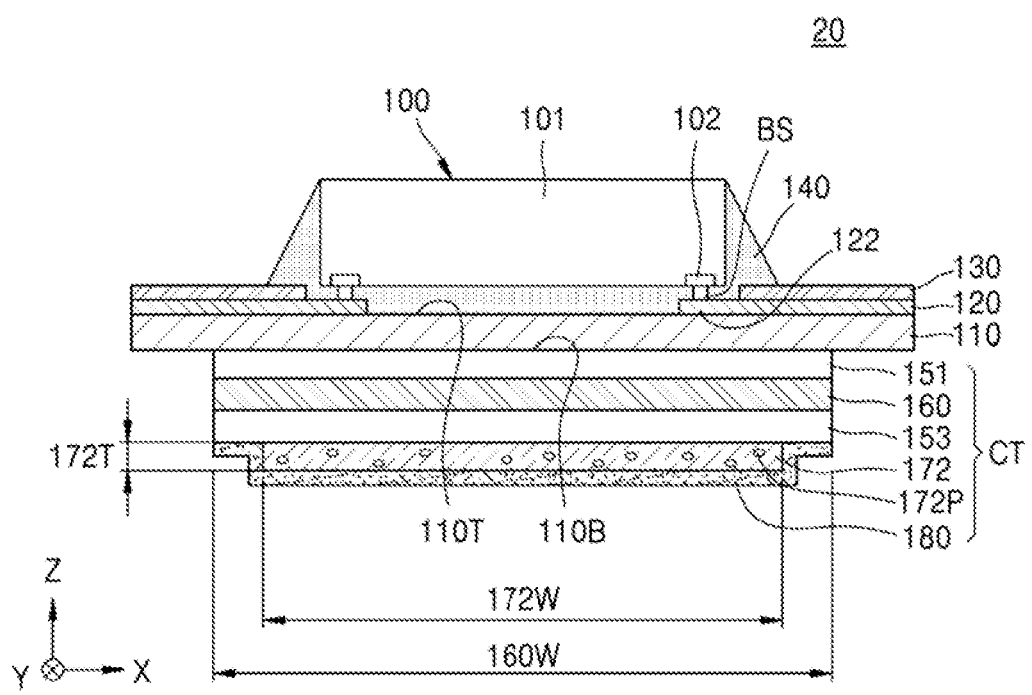
FIG. 5 is a side cross-sectional view of a COF package according to another embodiment.

FIG. 5 is a side cross-sectional view of a COF package according to another embodiment.

Most of components forming a COF package 20 and materials forming the components are substantially the same as or similar to those described with reference to FIGS. 2 to 4. Therefore, for convenience, a difference between the COF packages 10 and 20 is mainly described.

Referring to FIG. 5, the COF package 20 may include the semiconductor chip 100, the base film 110, and the composite material tape CT.

The COF package 20 according to an embodiment may include an insulating layer 172 that is a portion of the composite material tape CT and has pores 172P.

Sizes, shapes, the number, etc. of the pores 172P may be adjusted to form an aggregate of the pores 172P in the insulating layer 172. For example, the insulating layer 172 may include the pores 172P at a ratio of between about 5% and about 50%. As the pores 172P form an air gap, the insulating layer 172 may have decreased thermal conductivity and thus may effectively insulate the heat emitted from the semiconductor chip 100.

A width of the insulating layer 172 in the first direction (ex., the X direction) may be greater than the length of the long side 100L of the semiconductor chip 100, and a width of the insulating layer 172 in the second direction (ex., the Y direction) may be greater than the length of the short side 100S of the semiconductor chip 100. In some embodiments, a width 172W of the insulating layer 172 may be less than the width 160W of the heat emission layer 160. For example, a width of the insulating layer 172 in the first direction (ex., the X direction) may be less than the width of the heat emission layer 160 in the first direction (ex., the X direction), and a width of the insulating layer 172 in the second direction (ex., the Y direction) may be less than the width of the heat emission layer 160 in the second direction (ex., the Y direction), Also, a thickness 172T of the insulating layer 172 in the third direction (ex., the Z direction) may be between about 30 μm and about 100 μm to the insulating layer 172 from overly inhibiting the heat radiation transfer of the heat emission layer 160.

Figure 6:
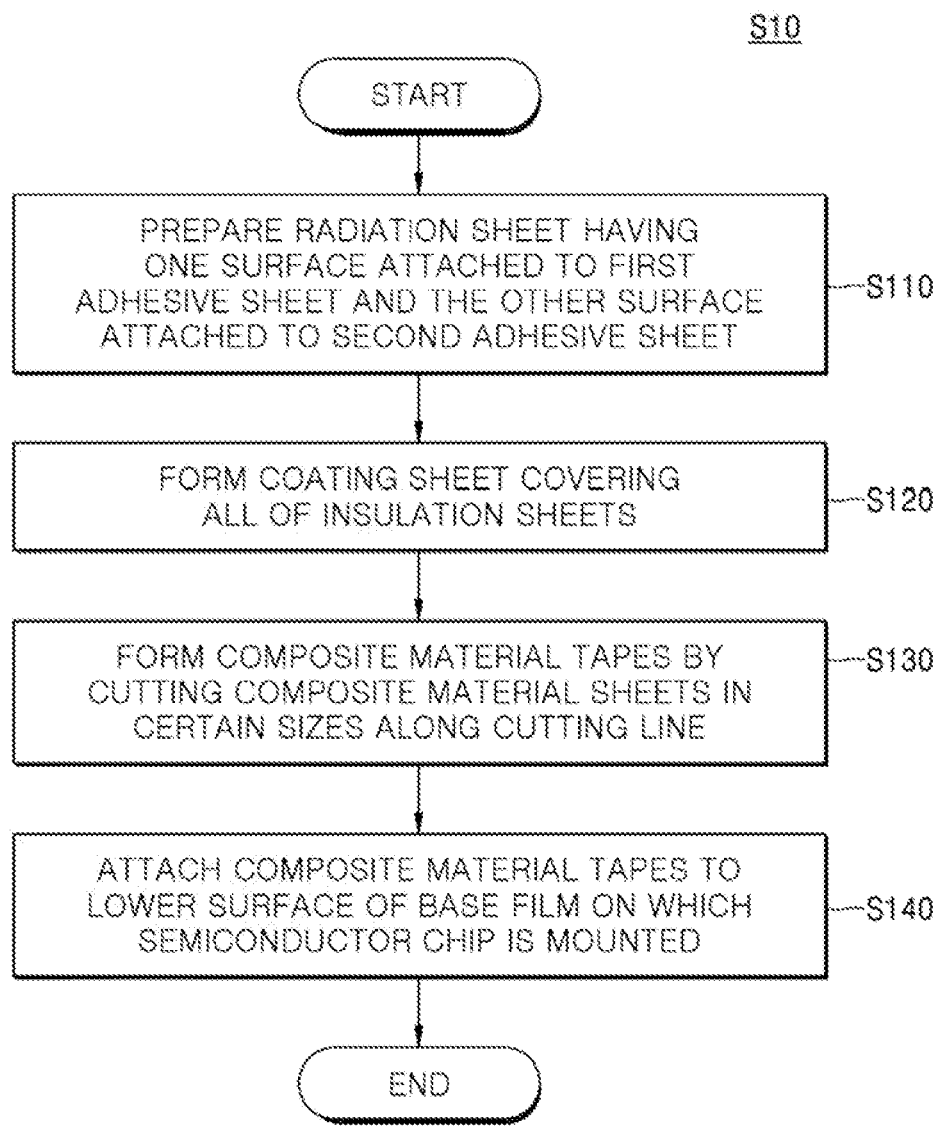
FIG. 6 is a block diagram of a method of manufacturing a COF package, according to an embodiment.

FIG. 6 is a block diagram of a method of manufacturing a COF package, according to an embodiment.

Referring to FIG. 6, a method S10 of manufacturing a COF package may include first to fourth operations (S110 to S140).

When a certain embodiment is implemented differently, a specific process order may be performed differently from the described order. For example, two described processes may be performed substantially at the same time or performed in a different order than the described order.

The method S10 of manufacturing a COF package according to an embodiment may include a first operation (S110) of preparing a radiation sheet, which has one surface attached to a first adhesive sheet and the other surface attached to a second adhesive sheet, a second operation (S120) of forming a coating sheet covering all insulation sheets, a third operation (S130) of forming composite material tapes by cutting a composite material sheet in uniform sizes along a cutting line, and a fourth operation (S140) of attaching the composite material tapes to the lower surface of the base film on which the semiconductor chip is mounted.

Technical features of the first to fourth operations (S110 to S140) will be described in detail with reference to FIGS. 7 to 10.

FIGS. 7 to 10 are diagrams illustrating a method of manufacturing a COF package, according to an embodiment.

Figure 7:
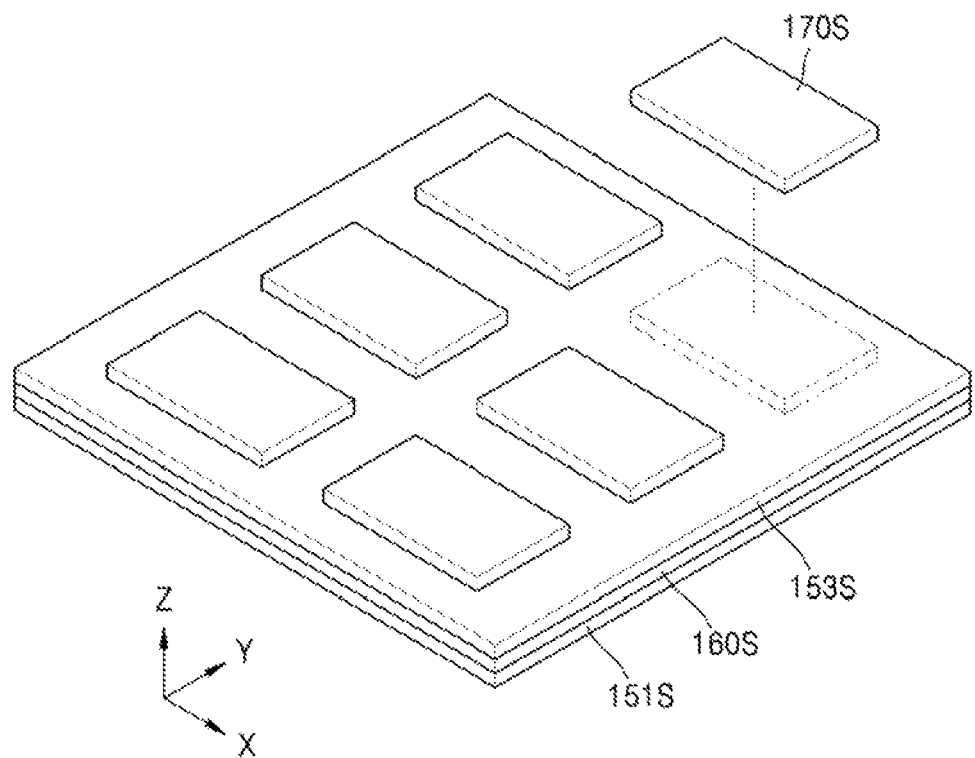
FIGS. 7 to 10 are diagrams sequentially illustrating a method of manufacturing a COF package, according to an embodiment.

Referring to FIG. 7, a radiation sheet 160S, which has one surface attached to a first adhesive sheet 151S and the other surface attached to a second adhesive sheet 153S, is prepared.

Insulation sheets 170S may be disposed on the surface of the radiation sheet 160S, to which the second adhesive sheet 153S is attached, at regular spacing intervals. The insulation sheets 170S may be fixed to the radiation sheet 160S by the second adhesive sheet 153S.

Figure 8:
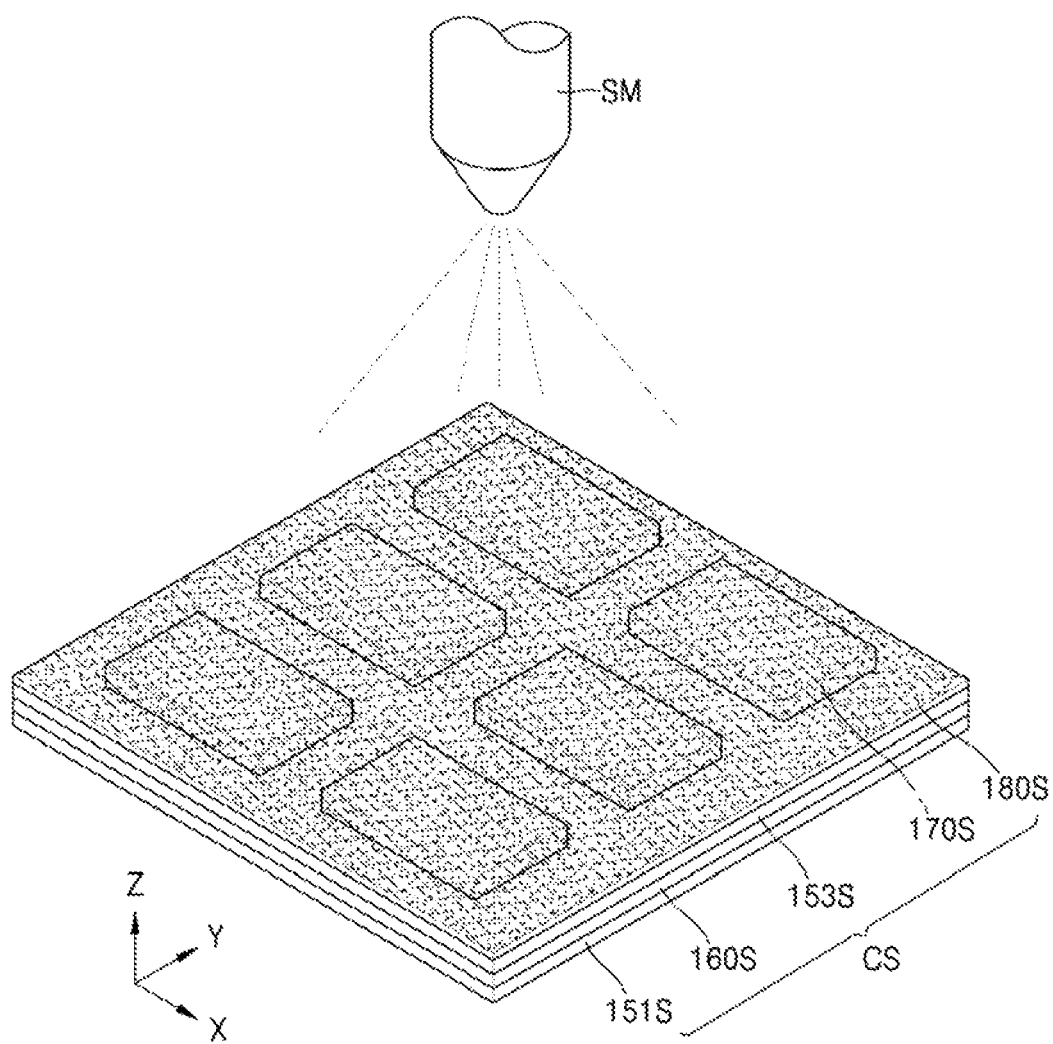

Referring to FIG. 8, a coating sheet 180S covering all of the insulation sheets 170S is formed.

The coating sheet 180S may be formed to protect the insulation sheets 170S from external physical and/or chemical damage. Also, the coating sheet 180S may be formed to prevent possible contaminants produced from insulation sheets 170S from being discharged to the outside.

The coating sheet 180S containing carbon may substantially cover the exposed upper and side surfaces of the insulation sheets 170S. The coating sheet 180S may be formed by using a spray coating process using a spray machine SM. Accordingly, the coating sheet 180S may be conformally formed on the insulation sheets 170S to prevent the insulation sheets 170S from being exposed to the outside.

As described above, a composite material sheet CS including the first adhesive sheet 151S, the radiation sheet 160S, the second adhesive sheet 153S, the insulation sheets 170S, and the coating sheet 180S may be formed.

Figure 9:
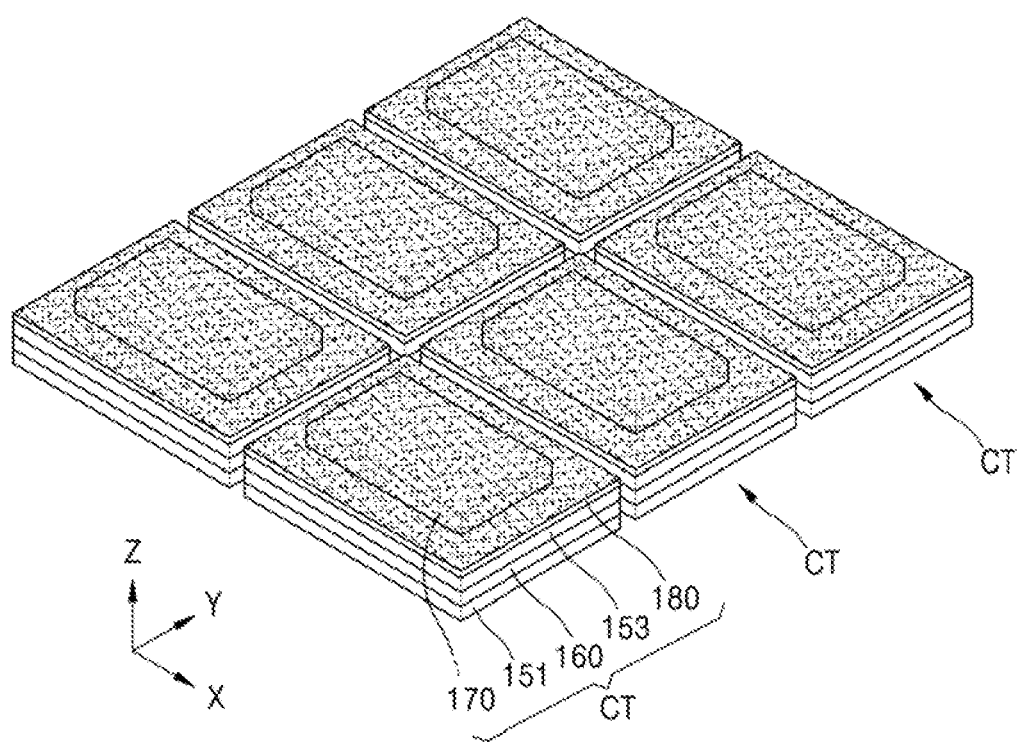

Referring to FIG. 9, composite material tapes CT are formed by cutting, in uniform sizes, the composite material sheet CS (see FIG. 8) along one or more cutting lines.

Each composite material tape CT may include the first adhesive layer 151, the heat emission layer 160, the second adhesive layer 153, the insulating layers 170, and the protective layer 180.

Here, a width of the insulating layer 170 in the first direction (ex., the X direction) may be less than the width of the heat emission layer 160 in the first direction (ex., the X direction), and a width of the insulating layer 170 in the second direction (ex., the Y direction) may be less than the width of the heat emission layer 160 in the second direction (ex., the Y direction).

Figure 10:
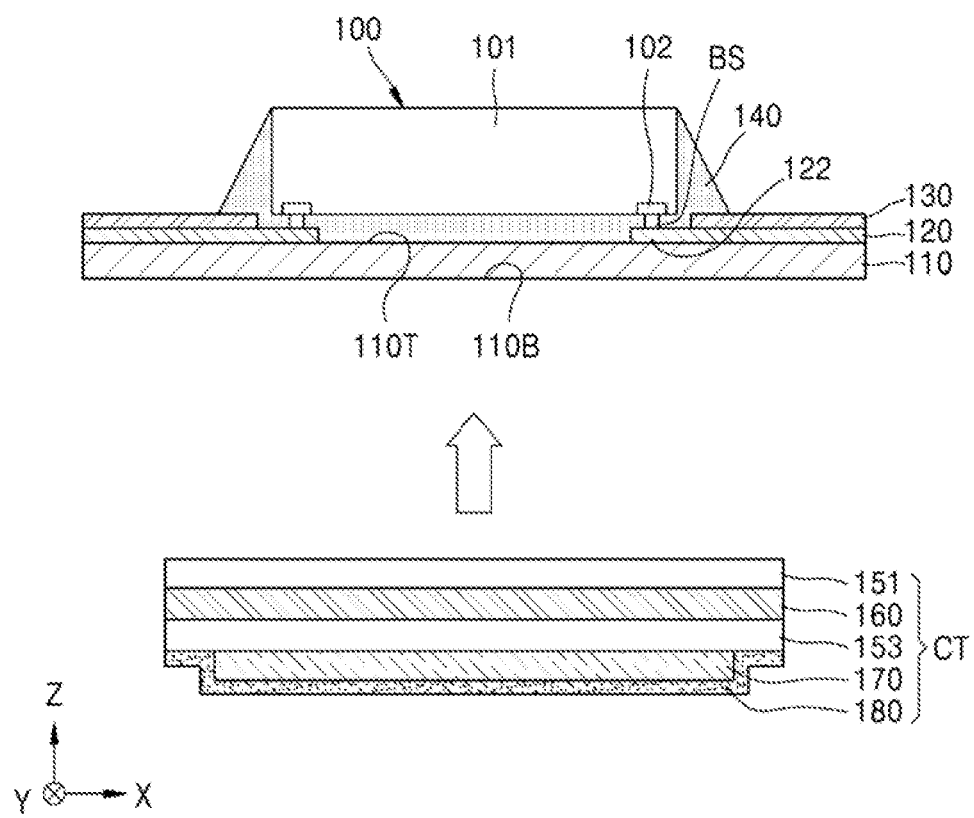

Referring to FIG. 10, the composite material tape CT is attached to the lower surface 110B of the base film 110 on which the semiconductor chip 100 is mounted.

The composite material tape CT manufactured above may be disposed such that the first adhesive layer 151 is attached to the lower surface 110B of the base film 110. The composite material tape CT may entirely overlap the semiconductor chip 100 in the third direction (ex., the Z direction) after being disposed on the lower surface 110B of the base film 110.

For effective heat radiation and insulation, the first width CTX (see FIG. 3) of the composite material tape CT in the first direction (ex., the X direction) may be greater than the length of the long side 100L (see FIG. 3) of the semiconductor chip 100, and the second width CTY (see FIG. 3) of the composite material tape CT in the second direction (ex., the Y direction) may be greater than the length of the short side 100S (see FIG. 3) of the semiconductor chip 100. In some embodiments, the composite material tape CT may be a flexible tape.

A process of manufacturing a COF package is not necessarily limited to the above-described process, and other manufacturing processes may be understood by one of ordinary skill in the art to fabricate an apparatus according to the present inventive concepts without undue technical difficulty.

Referring back to FIG. 4, according to the method of manufacturing the COF package 10, the COF package 10 capable of attaining the heat radiation transfer and insulation properties described above may be manufactured by using the composite material tape CT including the heat emission layer 160 and the insulating layer 170.

Figure 11:
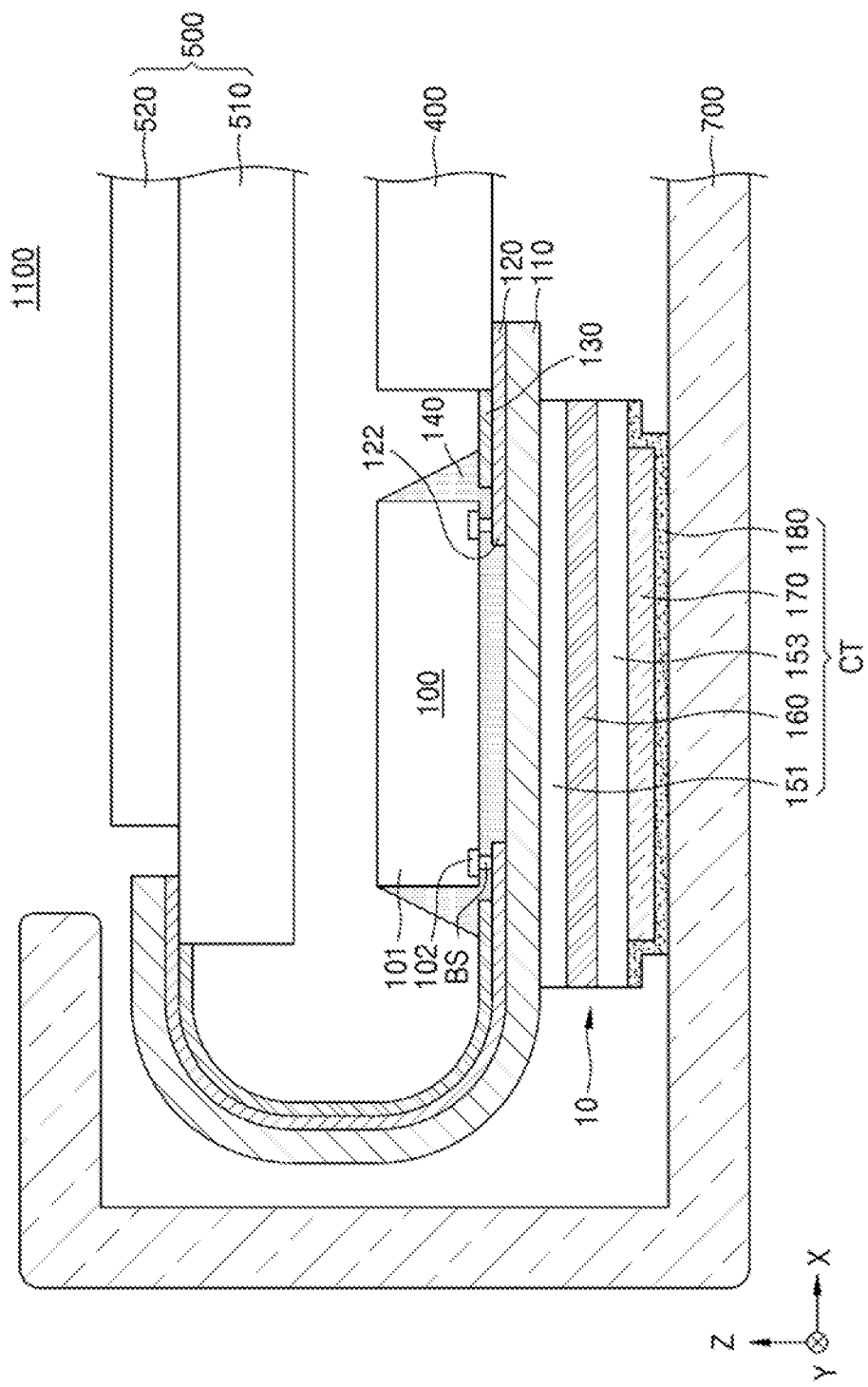
FIG. 11 is a side cross-sectional view of a display apparatus according to an embodiment.

FIG. 11 is a side cross-sectional view of a display apparatus according to an embodiment.

Referring to FIG. 11, the display apparatus 1100 may include the COF package 10, the driving printed circuit board 400, the display panel 500, and the bezel 700.

In the display apparatus 1100, the display panel 500 may include a transparent substrate 510 and an image area 520 formed on the transparent substrate 510. Here, the COF package 10 of FIG. 11 has a shape in which the COF package 10 of FIGS. 2 to 4 is partially bent, but embodiments of the present disclosure are not necessarily limited thereto. Also, the COF package 20 (see FIG. 5) may be mounted on the display apparatus 1100 instead of the COF package 10.

An edge of the COF package 10 may contact a portion of the display panel 500, and the other edge of the COF package 10 may contact a portion of the driving printed circuit board 400. The COF package 10 may receive a signal, which is output from the driving printed circuit board 400, through the conductive line 120 and may transmit the signal to the display panel 500 through the conductive line 120.

On the driving printed circuit board 400, one or more driving circuit chips 410 (see FIG. 1) configured to simultaneously or sequentially transmit power and signals to the COF package 10 through the conductive lines 120 may be mounted.

The display panel 500 may include the transparent substrate 510 and the image area 520 including pixels. The transparent substrate 510 may include front and rear surfaces opposite from each other, and the image area 520 may be on the front surface of the transparent substrate 510. The COF package 10 may be bent to the front surface of the transparent substrate 510 and fixed thereto, and the driving printed circuit board 400 may contact the rear surface of the transparent substrate 510.

In other words, the COF package 10 may be bent to a front surface of the display panel 500 and fixed thereto, and the driving primed circuit board 400 may be spaced from the display panel 500 in the third direction (ex., a Z direction).

The bezel 700 may form an exterior of the display apparatus 1100 and protect the COF package 10 and the driving printed circuit board 400.

The COF package 10 may be attached and fixed to part of the bezel 700. Therefore, the heat emitted from the semiconductor chip 100 may be transmitted to the bezel 700, but may be effectively insulated by the composite material tape CT included in the COF package 10.

The display apparatus 1100 may use the COF package 10 including the composite material tape CT that includes both the heat emission layer 160 and the insulating layer 170, and thus, the display apparatus may have increased heat transfer/ radiation and insulation, to remove heat and block heat, respectively, from sensitive components.

Eventually, the COF package 10 and the display apparatus 1100 including the same may be configured to reduce thermal fatigue and increase thermal resistance, and thus, the reliability of a product may be increased.

Figure 12:
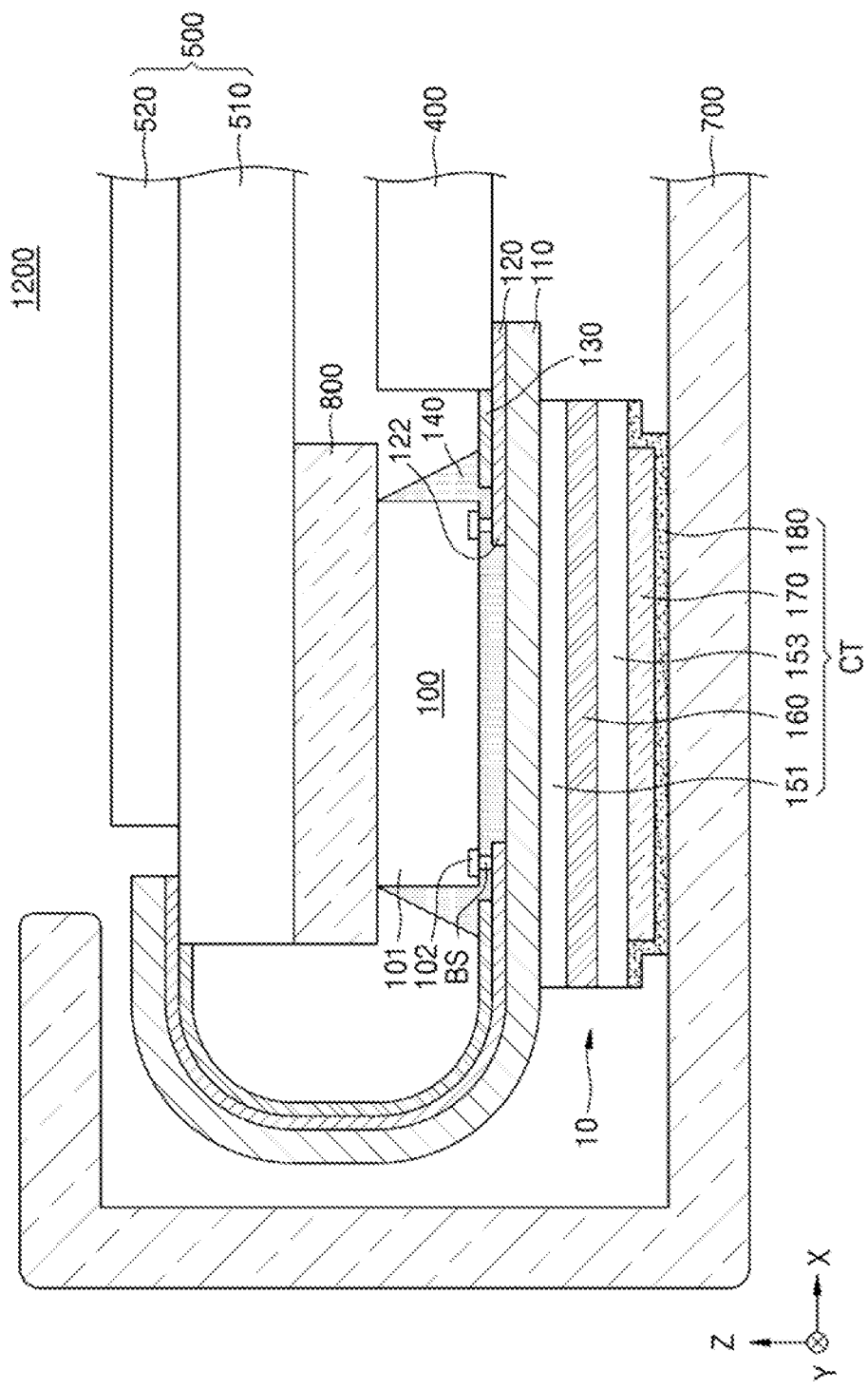
FIG. 12 is a side cross-sectional view of a display apparatus according to another embodiment.

FIG. 12 is a side cross-sectional view of a display apparatus according to another embodiment.

Most of components forming a display apparatus 1200 and materials of the components are substantially the same as or similar to those described with reference to FIG. 11. Therefore, for convenience, a difference between the display apparatuses 1100 and 1200 is mainly described.

Referring to FIG. 12, the display apparatus 1200 may include the COF package 10, the driving printed circuit board 400, the display panel 500, the bezel 700, and a radiation plate 800.

In the display apparatus 1200, the display panel 500 may include the transparent substrate 510 and the image area 520 including pixels. The transparent substrate 510 may include the front and rear surfaces opposite from each other, and the image area 520 may be on the front surface of the transparent substrate 510. The COF package 10 may be bent to the front surface of the transparent substrate 510 and fixed thereto, and the driving printed circuit board 400 may contact the rear surface of the transparent substrate 510.

The radiation plate 800 may be arranged between the COF package 10 and the transparent substrate 510. In detail, the radiation plate 800 may radiate the heat emitted from the semiconductor chip 100. Therefore, for effective heat radiation, the radiation plate 800 may contact the upper surface of the semiconductor chip 100 and the lower surface of the transparent substrate 510. For example, the radiation plate 800 may be arranged in a direction to the upper surface of the semiconductor chip 100, and the heat emission layer 160 may be arranged in a direction to the lower surface of the semiconductor chip 100.

In some embodiments, the radiation plate 800 may be a flat plate including metal. The metal may include at least one of, for example, Al, Cu, W, and the like, but is not necessarily limited thereto. In other embodiments, the radiation plate 800 may include epoxy, acrylic, silicon, or the like, and the resin may include a thermally conductive filler to obtain good radiation effects. The thermally conductive filler may include $Al_2O_3$, BN, AlN, or diamond.

While the inventive concepts have been particularly shown and described with reference to embodiments thereof, it will be understood that various changes in form and details may be made therein without departing from the spirit and scope of the following claims.

What is claimed is:

1. A chip-on-film package comprising:
   a base film comprising an upper surface and a lower surface opposite to the upper surface;
   a semiconductor chip mounted on the upper surface of the base film;
   a heat emission layer disposed on the lower surface of the base film to at least partially overlap the semiconductor chip in a thickness direction, wherein the heat emission layer is contiguously formed;
   an insulating layer disposed on a lower surface of the heat emission layer; and
   a protective layer surrounding side and lower surfaces of the insulating layer.

2. The chip-on-film package of claim 1, wherein the insulating layer comprises a plurality of pores in the insulating layer, and
   a thickness of the insulating layer is between about 30 μm and about 100 μm.

3. The chip-on-film package of claim 1, wherein the insulating layer comprises a material that has a melting point at a temperature exceeding about 150° C. and
   thermal conductivity from about 0.02 W/(m·K) to about 0.08 W/(m·K).

4. The chip-on-film package of claim 1, wherein the insulating layer composes heat-resistant fiber, graphite, and/or polyurethane.

5. The chip-on-film package of claim 1, wherein the heat emission layer comprises a metal material.

6. The chip-on-film package of claim 1, wherein the protective layer comprises carbon.

7. The chip-on-film package of claim 1, wherein, in a plan view, a horizontal width and a vertical width of the insulating layer are less than a horizontal width and a vertical width, respectively, of the heat emission layer overlapping the insulating layer in the thickness direction.

8. The chip-on-film package of claim 7, wherein the protective layer conformally covers:
   the side and lower surfaces of the insulating layer; and
   the lower surface of the heat emission layer exposed by the insulating layer.

9. The chip-on-film package of claim 8, wherein the protective layer is formed by using a spray coating method.

10. The chip-on-film package of claim 1, wherein the base film comprises a flexible insulation substrate.

11. A display apparatus comprising:
    a chip-on-film package comprising a base film that comprises an upper surface and a lower surface opposite from each other;

a display panel contacting a portion of the upper surface of the base film; and a driving printed circuit board contacting another portion of the upper surface of the base film, wherein the chip-on-film package comprises:
- a display driver IC mounted on the upper surface of the base film;
- a heat emission layer disposed on the lower surface of the base film to at least partially overlap the display driver IC in a thickness direction;

an insulating layer disposed on a lower surface of the heat emission layer; and a protective layer surrounding side and lower surfaces of the insulating layer.

12. The display apparatus of claim 11, wherein the base film comprises a flexible film.

13. The display apparatus of claim 11, wherein the display panel comprises a front surface comprising, a plurality of pixels, and a rear surface opposite to the front surface, the chip-on-film package is bent and fixed to the front surface of the display panel, and the driving printed circuit board contacts the rear surface of the display panel.

14. The display apparatus of claim 11, wherein the insulating layer comprises a plurality of pores in the insulating layer, and a thickness of the insulating layer is between about 30 μm and about 100 μm.

15. The display apparatus of claim 11, wherein the heat emission layer comprises a metal material, and the protective layer comprises carbon and is former by using a spray coating method.

* * * * *